(12) United States Patent
Launay et al.

(10) Patent No.: US 7,735,741 B2
(45) Date of Patent: Jun. 15, 2010

(54) METHOD FOR PRODUCTION OF A CARD WITH A DOUBLE INTERFACE AND MICROCIRCUIT CARD OBTAINED THUS

(75) Inventors: François Launay, Epron (FR); Jacques Venambre, Ifs (FR)

(73) Assignee: Oberthur Technologies, Levallois-Perret (FR)

( * ) Notice: Subject to any disclaimer, the term of this patent is extended or adjusted under 35 U.S.C. 154(b) by 1048 days.

(21) Appl. No.: 10/572,461

(22) PCT Filed: Oct. 12, 2004

(86) PCT No.: PCT/FR2004/002582

§ 371 (c)(1),
(2), (4) Date: May 1, 2006

(87) PCT Pub. No.: WO2005/038702

PCT Pub. Date: Apr. 28, 2005

(65) Prior Publication Data

US 2006/0255157 A1    Nov. 16, 2006

(30) Foreign Application Priority Data

Oct. 17, 2003   (FR) .................................. 03 12204

(51) Int. Cl.
*G06K 19/06* (2006.01)
(52) U.S. Cl. ...................... 235/492; 235/487
(58) Field of Classification Search ............ 235/492, 235/487, 488
See application file for complete search history.

(56) References Cited

U.S. PATENT DOCUMENTS 5,574,470 A * 11/1996 de Vall ................. 343/895
5,598,032 A * 1/1997 Fidalgo ................ 257/679
5,800,763 A * 9/1998 Hoppe et al. ............ 264/255
5,850,690 A * 12/1998 Launay et al. ........... 29/841
6,320,753 B1 * 11/2001 Launay ................. 361/760
2005/0223550 A1 10/2005 Launay

FOREIGN PATENT DOCUMENTS

EP    1 260 938    11/2002

(Continued)

OTHER PUBLICATIONS

Japanese Office Action dated May 15, 2009, and issued in corresponding JP Patent Appln. No. 2006-534786.

*Primary Examiner*—Daniel St. Cyr
(74) *Attorney, Agent, or Firm*—Young & Thompson

(57) ABSTRACT

A method for production of a microcircuit card, includes the production of a card with electronic component connector pins for an electronic component within the thickness thereof and provided with a cavity with a base and defined by a slope on which the connector pins are arranged and production of a module including a support film with external contacts on an external face thereof and internal contacts on an internal face thereof. An anisotropic flexible conducting adhesive is then applied to the periphery of the internal face of the film, a resin more rigid than the adhesive is introduced into the cavity of the body, the module is inserted into the cavity such that the anisotropic adhesive is located opposite the periphery of the slope of the cavity, the anisotropic adhesive is thermally activated under pressure and the resin polymerized.

26 Claims, 2 Drawing Sheets

FOREIGN PATENT DOCUMENTS

Figure 1:
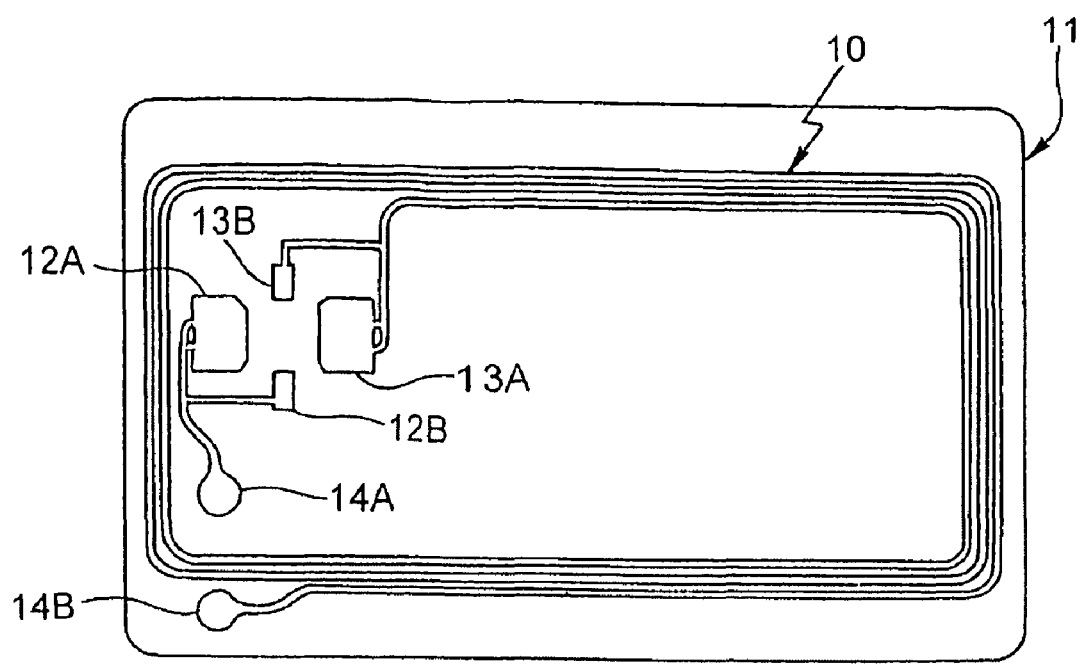

| | | |
|---|---|---|
| FR | 2 716 281 | 8/1995 |
| FR | 2 769 389 | 4/1999 |
| JP | 2000182017 | 6/2000 |
| JP | 2002358493 | 12/2002 |
| JP | 2003248808 | 9/2003 |
| WO | 03052822 | 6/2003 |

* cited by examiner

METHOD FOR PRODUCTION OF A CARD WITH A DOUBLE INTERFACE AND MICROCIRCUIT CARD OBTAINED THUS

FIELD OF THE INVENTION AND PRIOR ART

The invention relates to a microcircuit card including a microcircuit and, within its thickness, connecting terminals to a component that has to be connected to internal contacts of that microcircuit. It relates in particular, but not exclusively, to cards of the dual interface type, i.e. that use data transmitted via contacts and with data transmitted without contact, via an antenna. A card of this type is often called a "Dual Interface" card or a "Combi" card.

Cards of this type that use only one microcircuit are known in the art, in particular from the patent FR-2716281 (GEM-PLUS).

That microcircuit forms part of a module including a support film carrying the microcircuit on its internal face. The support film also has, on its external face, external contacts connected to the microcircuit and, on its internal face, internal contacts also connected to the microcircuit and co-operating with antenna connecting terminals within the thickness of the card. The module is fixed into a cavity of a card body within the thickness whereof the antenna is formed and the antenna terminals are accessible in that cavity.

Dual interface cards can give rise to serious reliability problems, resulting in practice from breaking of the electrical connections between the antenna terminals and the internal contacts of the module connected to the radio-frequency inputs/outputs of the microprocessor of the microcircuit.

Those connections are generally effected by soldering using metal alloys (usually tin-lead, indium-cadmium-lead or indium-tin) in paste form, by adhesive bonding using conductive adhesives, or by fixing the microcircuit using an anisotropic adhesive.

In practice, the cavity is bordered by a step where the terminals are accessible so that they can be connected to the microcircuit. The step on which the terminals are disposed may be a single step, in which case connection by means of an anisotropic conductive adhesive alone may suffice to assure mechanical retention and electrical connection, or flanked by a second step, in which case the module may be fixed by means of an adhesive between the periphery of the module and this second step while the electrical connections between the microcircuit and the terminals is effected using solder or a conductive adhesive (see above). As for the microcircuit, it is often coated in an encapsulation resin, for reasons of protection.

Now, in the event of mechanical bending that the card inevitably suffers during its life, the various connections are subjected to high mechanical stresses that tend to detach the microcircuit from the support film and also, and more importantly, to detach the module from the card body which, a fortiori, breaks the electrical connections between said microcircuit and the antenna terminals.

The connection between the module and the antenna must in fact be sufficiently rigid both to hold the microcircuit during bending cycles and to maintain the electrical connection, but it is also desirable for them to be sufficiently flexible to absorb the high stresses exerted on them without breaking.

In this respect, connections using solder or conductive adhesive appear to be too rigid, since they tend often to break (cohesive breaks).

The behavior of conducting anisotropic adhesives varies as a function of their flexibility.

Thus a rigid adhesive with a high Young's modulus suffers high stresses even for small deformations and tends to remain deformed (beyond its elastic limit) or to break.

In contrast, a flexible adhesive could deform easily and thereby absorb the stresses. However, this degree of deformation is not desirable in terms of preserving the electrical connections, in that electrical connections using an anisotropic conductive adhesive are made by conductive balls embedded in the mass of adhesive. Furthermore, the card body carrying the antenna terminals, which is often made of a plastics material, may itself be deformed permanently or visco-elastically on bending or as the result of thermal cycles. A very flexible adhesive mass can therefore lead to movement of the conductive balls with the possible consequence of irreversible or intermittent breaking of the electrical connections.

An essential characteristic of anisotropic conductive adhesives is that conductivity is achieved only if a sufficient number of conductive balls (in practice a few tens of balls per $mm^2$) are "crushed" between the two conductive surfaces connected by said adhesive.

It is therefore obvious that residual deformation of the plastics card body or of the module carrying the microcircuit and significant displacement (stretching) of the adhesive mass may significantly affect the electrical connections by moving the balls or by increasing the distance between the two surfaces so that the balls are no longer in contact with one or the other of those surfaces.

Failing a satisfactory compromise between flexibility and stiffness with a single material, one option is to operate on the properties of the materials at the peripheries of the module and the cavity, in the situation cited above with two steps, using one material to provide the mechanical bond to the plastics support and another material to make the electrical connections. However, the combination of materials used at present at the periphery of the cavity (insulative adhesive, on the one hand, and solder paste or conductive adhesive, on the other hand) are not satisfactory, for the following reasons:

this configuration does not prevent residual deformation of the plastics card body and/or the microcircuit,
   it is often difficult to use two different materials in the immediate vicinity of each other (risk of mixing and of mutual pollution),
   experience shows that the mechanical stresses exerted on the conductive material are still too high.

The above problems may be encountered not only with an antenna but also with other components, whether embedded or not, connected to terminals situated within the thickness of a card body, in particular with display screens, heat sensors, batteries, fingerprint sensors, etc.

TECHNICAL PROBLEM AND STATEMENT OF THE INVENTION

An object of the invention is to overcome the drawbacks cited above thanks to a configuration that does not significantly complicate the fabrication process but guarantees that low stresses applied to the electrical connections, at the same time as reducing the risk of residual deformation of the card body near the cavity.

To this end the invention proposes a method for fabricating a microcircuit card, wherein a card body with connecting terminals for an electronic component within the thickness thereof and provided with a cavity having a bottom and bordered by a step on which said connecting terminals are situated is made and a module comprising a support film with external contacts on an external face thereof and internal contacts and a microcircuit connected to said internal contacts on an internal face thereof is made, and wherein, then:

an anisotropic flexible conductive adhesive is applied to the periphery of the internal face of said film, a resin which, after polymerization, is more rigid than the adhesive is introduced into the cavity of the card body, the module is inserted into the cavity in such a manner that the anisotropic adhesive is located opposite the periphery of the step of the cavity, and the anisotropic adhesive is thermally activated under pressure and the resin is polymerized.

The component is advantageously an antenna.

In other words, the invention proposes to combine the use of a flexible anisotropic adhesive at the periphery of the cavity and a rigid resin to fix the microcircuit into the cavity.

Using this kind of configuration allows elastic deformation of the adhesive at the periphery in the event of mechanical bending at the same time as greatly reducing the deformation of the support film and of the microcircuit in the cavity and tends to return the system to its initial state after bending.

Using a microcircuit protection resin to fix the microcircuit into a cavity in a card body, in practice of plastics material, is in fact already known in the art, in particular from the following documents of the applicant: EP-0 519 564, EP-1 050 844, EP-1 050 845 and FR-2833801. A module is fixed into a cavity by means of an encapsulation resin that coats the microcircuit and its connecting leads. In fact, this resin for encapsulating the microprocessor and its connecting leads is not deposited on the support film of the microcircuit but instead in the cavity of the plastics support, before inserting the microcircuit. Thus it is easy to control the volume of encapsulation resin, which is limited naturally by the cavity.

The document EP-0 519 564 even proposes further disposing an adhesive between the periphery of the module and a step bordering the cavity at an intermediate level. However, the adhesive and the resin have the same mechanical bonding function.

It should further be emphasized that the above documents concern cards that are simpler than those to which the invention relates in that they include no antenna or component provided with buried connecting terminals, so that the only problem to be solved is to ensure good mechanical retention of the module and of the microcircuit that it includes without at the same time having to consider the electrical connections between the module and the card body. There is therefore no reference in the above documents to preserving any terminals at the periphery of the cavity.

Given the usual problems of making a good electrical connection between a module and the antenna terminals, it is standard practice in the fabrication of "dual interface" cards to encapsulate the microcircuit before mounting the module in a cavity in a card body (the expression "pre-encapsulated microcircuit" refers to this practice).

Moreover, when using an anisotropic conductive adhesive has been proposed, this has generally been to provide simultaneously a mechanical bond and an electrical connection, and not for co-operation with another material providing the mechanical bonding function.

The invention nevertheless proposes to combine those materials, and further to select the anisotropic conductive adhesive and the resin as a function of each other so that the adhesive is significantly more flexible than the resin, i.e. so that its Young's modulus is lower than that of the resin.

Now, it has become clear that an encapsulation resin and an anisotropic conductive adhesive are perfectly compatible, and could therefore be used simultaneously, with no risk of mixing of the two materials and with no risk of deterioration of the conductive terminals at the periphery of the cavity. Furthermore, modern procedures can now produce reliable electrical connections between connecting contacts of a microcircuit and antenna terminals within the card body at the same time as fixing the microcircuit into the cavity.

According to the invention, it is preferable to choose a microcircuit encapsulation resin having a significant shrinkage coefficient (a few %).

The phenomenon of shrinking of the resin or of contraction of the volume occupied by the resin occurs during polymerization of the resin. Thus an epoxy resin, for example, goes from a viscous state to a solid state through the formation of a three-dimensional array of molecules characteristic of the polymerized resin.

The above mechanism, together with the evaporation of any solvents used in the resin, leads to a contraction of the volume of the encapsulating agent, which will therefore exert a "return force" between the surface (generally the bottom) of the cavity in the card body and the microcircuit, and more generally the module as a whole.

This phenomenon (of the order of a few percent by volume, typically from 1 to 5% by volume) helps to prevent the effects of separation at the interfaces and thereby contributes to stiffening the card body plus microcircuit assembly in the region of the cavity (and thus of the antenna terminals), thereby greatly limiting residual deformation after bending.

This makes it all the more acceptable to choose a very flexible anisotropic adhesive (for example one using a polyester matrix), since the latter will more readily withstand mechanical stresses without this leading to irreversible deterioration of the electrical connection (obtained, it will be remembered, by "crushing" the conductive balls).

For example, mechanical bending cycles have been effected in accordance with the international standard ISO 10373 on dual interface cards produced in accordance with the present invention and on dual interface cards produced using pre-encapsulated microcircuits bonded by a semi-rigid anisotropic adhesive widely used in the art: the cards produced in accordance with the invention all appeared to be perfectly functional after 4000 bending cycles whereas certain of the "reference" cards were already no longer functioning after only 1250 cycles and after 4000 cycles all the reference cards appeared to have failed.

It was also apparent that the structure obtained additionally resists pressure forces much better, the resin bonding the microcircuit to the bottom of the cavity preventing deformation of the microcircuit relative to the plastic card body if pressure is applied to it.

Note that the present invention may advantageously be used with a plastics card body structure alternating layers having mechanical and thermal properties optimized to resist bending without initiation of internal cracks that could also affect the strength of the connections between the microcircuit and the antenna (or the component concerned).

According to another advantageous feature of the invention, the antenna terminals are multiple and divided into a plurality of areas around the cavity (preferably longitudinally and transversely relative to the longitudinal axis of the card body), which reduces the requirements for good positioning of the module relative to the cavity during fixing, and minimizes the risk of disconnection on bending, whether parallel to the shorter side or to the longer side of the card.

Thus, according to advantageous features of the invention, which may where appropriate be combined:

the component is an antenna;

the resin is chosen to have a shrinkage coefficient on polymerization of the order of at least 1% whereby the volume occupied by said resin shrinks during that operation;

the resin is polymerized at a temperature lower than that at which the adhesive is thermally activated;

the adhesive is activated at an activation temperature of the order of 150° C.-160° C. and the resin is polymerized at a temperature significantly lower than that activation temperature (for example around 60° C.);

the connecting terminals are conformed so that at least one of them is divided into at least two areas disposed at a distance from each other;

the connecting terminals are conformed so that these two areas are situated in areas of the step having different orientations relative to a reference direction of the card body;

each connecting terminal is conformed so that it is divided into at least two connecting areas that face the connecting areas of the other connecting terminal in different directions;

each connecting terminal is conformed so that each of them is divided into at least two connecting areas one of which borders the cavity transversely relative to the card body and the other of which borders the cavity longitudinally relative to the card body;

the internal contacts of the module that face the connecting terminals are formed as a plurality of contact areas;

the contact areas are disposed so that they border the cavity in different directions;

the card body is produced from layers of materials chosen from the group consisting of polyvinylchloride, acrylonitrile butadiene styrene, polyethylene terephthalate and polycarbonate;

the card body is produced in the form of an alternation of such layers.

The invention also proposes a microcircuit card adapted to be obtained accordingly to this method, that is to say, a microcircuit card including a card body having terminals within its thickness for connecting it to a component, a cavity having a bottom and bordered by a step on which the connecting terminals are situated, and a module including a support film having an external face carrying external contacts and an internal face carrying internal contacts and a microcircuit connected to said internal contacts, in which microcircuit card:

the internal contacts are connected to the connecting terminals by an anisotropic conductive adhesive, the microcircuit is encapsulated in a resin that is more rigid than the adhesive and extends as far as a portion of the bottom of the cavity.

The advantageous features mentioned above with reference to the method apply here. In particular, the component is advantageously an antenna.

DESCRIPTION OF THE INVENTION

Figure 2:
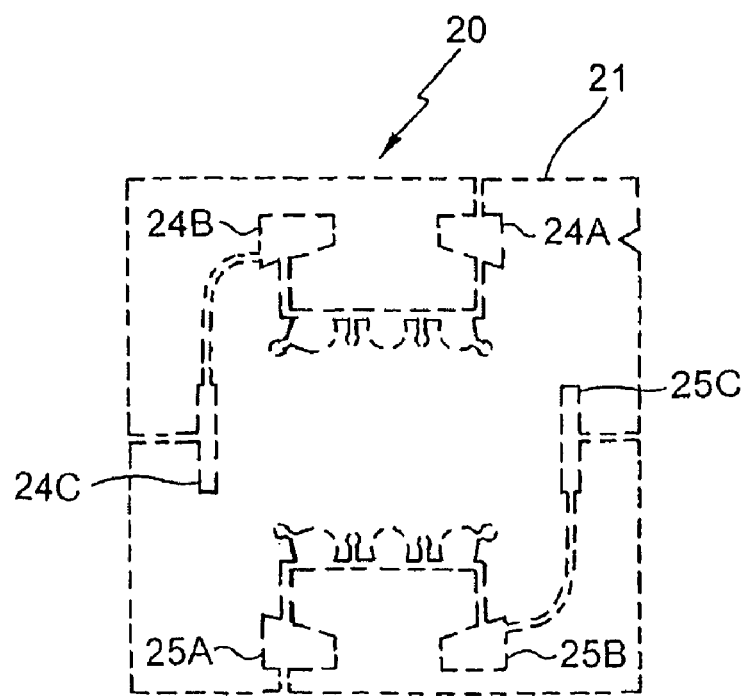
Figure 3:
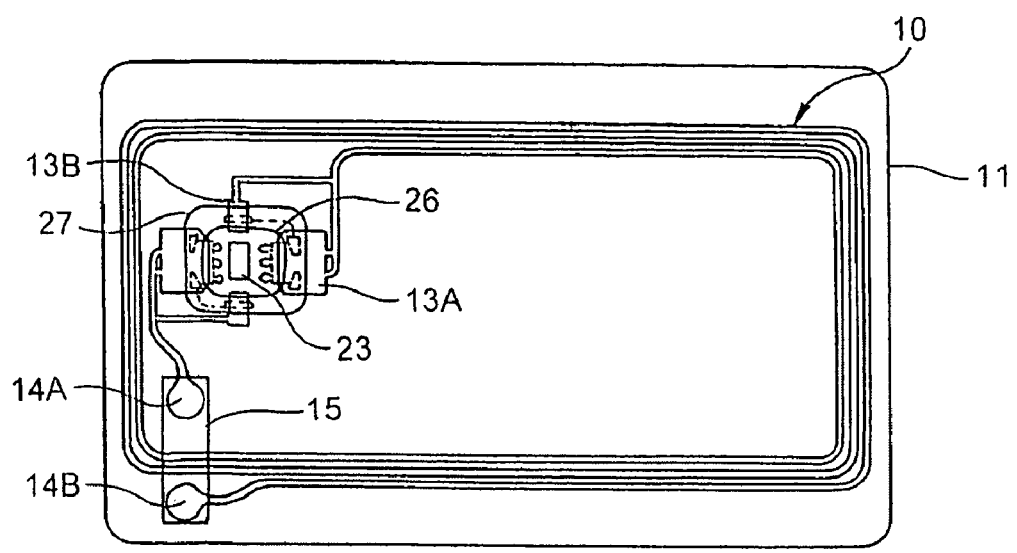
Figure 4:
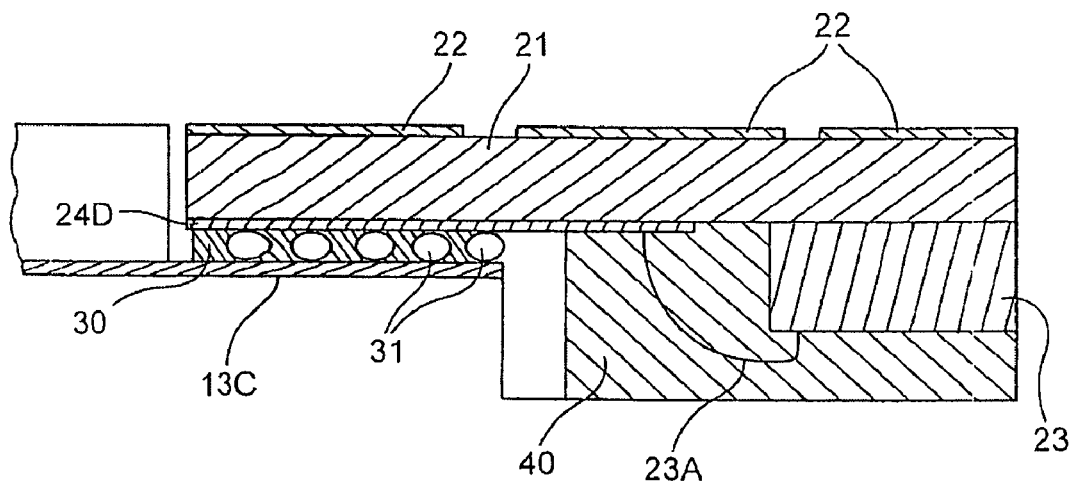
Figure 5:
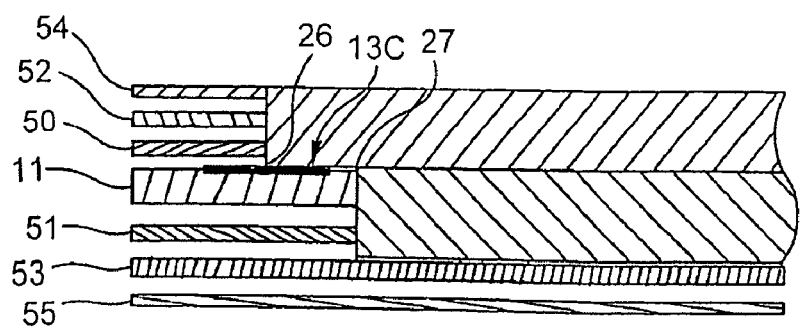

Objects, features and advantages of the invention emerge from the following description, which is given by way of nonlimiting illustration and with reference to the appended drawings, in which:

FIG. 1 is a top view of an antenna and its connecting terminals, in a preferred embodiment of the invention, FIG. 2 is a bottom view of the module, showing internal contacts, FIG. 3 is a top view showing both the antenna and the superposition of internal contacts of the module and the connecting terminals, FIG. 4 is a partial view in section of a microchip card integrating the antenna and the module, and FIG. 5 is a view in section showing a card body adapted to co-operate with the module from FIG. 2, in a different embodiment of the invention.

The appended drawings represent various steps in the fabrication of a microchip card of the invention.

FIG. 1 shows a component that consists of an antenna 10 produced on a film 11 commonly called the inlay. Here the inlay has substantially the same format as the card body of which the antenna will form a part and the turns extend substantially along each side of the inlay. In a different embodiment, not shown, the antenna is substantially smaller.

The antenna is formed of conductive turns, typically of photo-etched copper.

The antenna advantageously includes two connecting terminals divided into a plurality of areas, here two areas for each terminal: to be more precise, the antenna has two connecting areas 12A and 13A disposed face to face along a longitudinal direction of the inlay and two other connecting areas 12B and 13B also disposed face to face, but in a direction different from that of the areas cited above, here in a transverse direction of the inlay.

Accordingly, in the example considered here, each end of the antenna is divided into at least two areas that face areas of its other end in at least two different directions of the inlay.

In practice, starting with a PVC film with a thickness of the order of 200 microns, for example, an array of generally identical antennas is traced by chemically etching an electroplated copper layer to a thickness of the order of 35 microns.

As is known in the art, the geometry of the antenna conforms to precise electrical specifications (in particular, tuning frequency for a given capacitance of the printed circuit with which each antenna is intended to co-operate, resistance selected as a function of the Q, etc.). The significant geometrical parameters are the width of the antenna, the width and spacing of the turns, the thickness of copper, etc.

Dividing the ends of the antenna into a plurality of connecting areas increases the area making the connection (and thus reduces the contact resistance) and renders the final connection reliable. This is because the lateral areas 12A and 13A (disposed longitudinally of the inlay) are more sensitive to bending stresses along the longer side whereas the vertical areas 12B and 13B (disposed transversely of the inlay) are more sensitive to bending stresses along the shorter side of the inlay. This therefore optimizes the probability of retaining contact with the antenna, regardless of the type of bending suffered.

Note that the antenna is incomplete here, because FIG. 1 shows two terminals 14A and 14B disposed above and below the lower fibers. The connection between these terminals may be effected by a bridge (15, FIG. 3) produced on the face of the inlay opposite the turns of the antenna.

A hot pressing operation advantageously buries the turns and the bridge in the thickness of the material constituting the inlay, which minimizes the raised patterns caused by the turns and the bridge.

In a manner that is known in itself, a lamination step is then carried out so that the film on which the array of antennas is formed is sandwiched between other films inside an array of card bodies. Each card body is then cut out, in the conventional manner.

The thickness of the films that are laminated is chosen to situate the turns at the required depth, for example at a depth of 260 microns from the upper surface of the card body. This distance is defined as a function of the geometry of the module with which the antenna is intended to co-operate.

After cutting them out to the shape of a microchip card, the laminated films together form a card body.

In parallel with the above there is prepared for each antenna a module 20 including, on a support film 21, external contacts 22, a microcircuit 23 and internal contacts connected by leads 23A to the microcircuit (see above).

This preparation includes, for example, sawing the printed circuits and then bonding them to the support film, fixing connecting leads by soldering. The production of a module for a dual interface card preferably requires the use of modules having layers of conductors on each of their faces, with holes through the support film, whether metal-plated or not; there is, for example, a higher level of 35 micron copper conductors, as on conventional modules with external contacts (IS Vcc, Vss, etc. contacts), and a lower level for electrically connecting the antenna to the inputs of the microcircuit. In principle the antenna is not accessible from the outside.

The geometry of the external contacts 22 is not described in detail here as it forms no part of the invention.

FIG. 2 represents one embodiment of the geometry of the internal contacts of a module (which are therefore at the lower level cited above). By analogy with what has been said with reference to the antenna connection shapes, each internal contact of the module is divided into at least two areas facing the areas of the other contact in at least two directions.

To be more precise, the module 20 here includes a first internal contact subdivided into two areas 24A-24B connected by a track to another area 24C and a second internal contact divided into two areas 25A-25B connected by a track to another area 25C. The areas 24A-24B and the areas 25A-25B face each other in a direction that becomes the longitudinal direction of the card body and the areas 24C and 25C face each other in a direction orthogonal to the first direction. Here the contact areas are either trapeziums or rectangles and are connected to circular areas for connection to wires. Other shapes of these contact areas are possible, of course.

FIGS. 3 and 4 represent the combination of a card body and a module. For reasons of legibility in FIG. 3, certain components are shown as if the components that in fact cover them were transparent.

Each card body includes a cavity for receiving a module.

This cavity crosses the plane of the antenna and the connecting terminals of the antenna are on a step bordering the cavity. The cavity may pre-exist but is preferably formed at the end of assembling the card body. To this end, any appropriate means known in the art may be used to detect the location of the antenna and material (for example PVC) is then removed until the copper of the turns is laid bare.

FIG. 3 shows the turns of the antenna, the bridge 15 connecting the terminals 14A and 14B under the inlay, the contours of the cavity (the external contour 26 and the internal contour 27), the microcircuit 23 and the connecting areas of the module as if the components that in fact cover them were transparent. Note that the areas 24A to 24C and the areas 25A to 25C are collectively in contact with the antenna connecting terminals.

FIG. 4 is a view in section of a module fixed into a card body according to the FIG. 3 configuration.

Note that an adhesive 30 is disposed on the step delimited by the contours 26 and 27 of FIG. 3, between the terminals 12B and 13B and the areas 24C and 25C, and that a block of resin 40 encapsulating the microcircuit 23 extends as far as the bottom of the cavity, below the plane of the antenna.

The adhesive 30 is a conductive anisotropic adhesive and contains conductive balls 31 shown diagrammatically (they are of course much smaller than they appear in the drawing, which is not to scale).

The adhesive and the resin are chosen so that the adhesive 30 is more flexible than the resin 40.

The resin 40 is advantageously adapted to shrink, for example as a result of its polymerization or the evaporation of solvents.

The operations of assembling this module into the card body may be carried out as indicated above.

When the module is ready, its periphery is coated with the adhesive 30, which is preferably a "Hot Melt" adhesive with silver-plated balls having a diameter of the order of 20 to 40 microns buried in a matrix that can be activated by a temperature from 110° C. to 150° C. To obtain sufficient flexibility, the matrix is a polyester matrix, for example.

Moreover, the resin 40 is deposited in the cavity of the card body before the module, so as to encapsulate the microcircuit in the resin and to bring the adhesive 30 into contact with the antenna terminals.

The resin 40 is advantageously an epoxy resin of high ionic purity having a significant shrinkage coefficient.

After depositing the module, the adhesive is activated at a temperature close to 160° C. for a very short time, of the order of 500 ms to 2 s, and at an appropriate pressure to ensure good adhesion of the adhesive 30 to the areas that it connects electrically. The resin is then polymerized at a substantially lower temperature (so as not to weaken the adhesive), typically around 450° C.-60° C.

It will be appreciated that, although the adhesive is activated at a temperature significantly higher than the polymerization temperature, and given the time necessary for activation of the adhesive, the quasi-simultaneous processing of the diverse materials appears not to give rise to any particular implementation problems.

In the present example, using a resin having a high shrinkage coefficient guarantees that there is always a force tending to move the module toward the bottom of the cavity, which helps to reduce the risk of electrical disconnection between the internal contacts of the module and the antenna terminals in the event of bending forces to which the card body/module assembly, i.e. the smart card to be obtained, may be subjected.

FIG. 5 represents one embodiment of a stack of films from which a card body is obtained.

Lamination consists in depositing polymer (PVC, PET, etc.) films on respective opposite sides of the inlay at raised temperature and under pressure.

In the example shown, the inlay 11, which is 200 microns thick, is sandwiched between two compensation layers 50 and 51 approximately 100 microns thick; this stack 50+11+51 is in turn sandwiched between two printing layers 52 and 53, typically 140 microns thick. Finally, cover layers 54 and 55 form the exterior surfaces of the card body.

Thus the card body is advantageously formed of a stack of layers of materials chosen in the group consisting of polyvinylchloride, acrylonitrile butadiene styrene, polyethylene terephthalate and polycarbonate; there is preferably an alternation of such layers.

These layers have been moved apart, to clarify the figure, but it must be understood that in practice they are contiguous.

Note further that the step is formed on the upper surface of the inlay and that the cavity descends below the plane of this surface, through the inlay and the compensation layers, the lower printing and cover layers remaining intact.

The flowchart of the method may therefore be defined as follows:
- saw integrated circuits,
- bond into module,
- solder connecting leads,
- deposit anisotropic conductive adhesive,
- machine cavity,
- deposit resin,
- fix module into card body,
- pre-personalization test,
- graphical personalization.

This physically completes the card.

The invention claimed is:

1. A method for fabricating a microcircuit card, wherein a card body with connecting terminals for an electronic component within the thickness thereof and provided with a cavity having a bottom and bordered by a step on which said connecting terminals are situated is made and a module comprising a support film with external contacts on an external face thereof and internal contacts and a microcircuit connected to said internal contacts on an internal face thereof is made, and wherein, then:
- an anisotropic flexible conductive adhesive is applied to the periphery of the internal face of said film,
- a resin which, after polymerization, is more rigid than the adhesive is introduced into the cavity of the card body,
- the module is inserted into the cavity in such a manner that the anisotropic adhesive is located opposite the periphery of the step of the cavity, and
- the anisotropic adhesive is thermally activated under pressure and the resin is polymerized.

2. The method according to claim 1, characterized in that the component is an antenna.

3. The method according to claim 1, characterized in that the resin is chosen to have a shrinkage coefficient on polymerization of the order of at least 1% whereby the volume occupied by said resin shrinks during that operation.

4. The method according to claim 1, characterized in that the resin is polymerized at a temperature lower than that at which the adhesive is thermally activated.

5. The method according to claim 4, characterized in that the adhesive is activated at an activation temperature of the order of 150° C.-160° C. and the resin is polymerized at a temperature significantly lower than that activation temperature (for example around 60° C.).

6. The method according to claim 1, characterized in that the connecting terminals are conformed so that at least one of them is divided into at least two areas disposed at a distance from each other.

7. The method according to claim 6, characterized in that the connecting terminals are conformed so that these two areas are situated in areas of the step having different orientations relative to a reference direction of the card body.

8. The method according to claim 6, characterized in that each connecting terminal is conformed so that it is divided into at least two connecting areas that face the connecting areas of the other connecting terminal in different directions.

9. The method according to claim 6, characterized in that each connecting terminal is conformed so that each of them is divided into at least two connecting areas one of which borders the cavity transversely relative to the card body and the other of which borders the cavity longitudinally relative to the card body.

10. The method according to claim 1, characterized in that the internal contacts of the module that face the connecting terminals are formed as a plurality of contact areas.

11. The method according to claim 10, characterized in that the contact areas are disposed so that they border the cavity in different directions.

12. The method according to claim 1, characterized in that the card body is produced from layers of materials chosen from the group consisting of polyvinylchloride, acrylonitrile butadiene styrene, polyethylene terephthalate and polycarbonate.

13. The method according to claim 12, characterized in that the card body is produced in the form of an alternation of such layers.

14. A microcircuit card including a card body having within the body connecting terminals for connecting to a component, a cavity having a bottom and bordered by a step on which the connecting terminals are situated, and a module including a support film having an external face carrying external contacts and an internal face carrying internal contacts and a microcircuit connected to said internal contacts, in which microcircuit card:
- the internal contacts are connected to the connecting terminals by an anisotropic conductive adhesive, and
- the microcircuit is encapsulated in a resin that is more rigid than the adhesive and extends as far as a portion of the bottom of the cavity.

15. The microcircuit card according to claim 14, characterized in that the component is an antenna.

16. The microcircuit card according to claim 14, characterized in that the resin is chosen to have a shrinkage coefficient of the order of at least 1% during polymerization whereby the volume occupied by said resin is under tension after that operation.

17. The microcircuit card according to claim 14, characterized in that the resin is polymerized at a temperature lower than that at which the adhesive is activated.

18. The microcircuit card according to claim 17, characterized in that the adhesive is activated at an activation temperature of the order of 150° C.-160° C. and the resin is polymerized at a temperature significantly lower than that activation temperature (for example around 60° C.).

19. The microcircuit card according to claim 14, characterized in that the connecting terminals are conformed so that at least one of them is divided into at least two areas disposed at a distance from each other.

20. The microcircuit card according to claim 19, characterized in that the connecting terminals are conformed so that these two areas are situated in areas of the step having different orientations relative to a reference direction of the card body.

21. The microcircuit card according to claim 19, characterized in that each connecting terminal is conformed so that it is divided into at least two connecting areas that face the connecting areas of the other connecting terminal in different directions.

22. The microcircuit card according to claim 19, characterized in that each connecting terminal is conformed so that each of them is divided into at least two connecting areas one of which borders the cavity transversely relative to the card body and the other of which borders the cavity longitudinally relative to the card body.

23. The microcircuit card according to claim 14, characterized in that the internal contacts of the module that face the connecting terminals are formed as a plurality of contact areas.

24. The microcircuit card according to claim 23, characterized in that the contact areas are disposed so that they border the cavity in different directions.

25. The microcircuit card according to claim 14, characterized in that the card body is produced from layers of materials chosen from the group consisting of polyvinylchloride, acrylonitrile butadiene styrene, polyethylene terephthalate and polycarbonate.

26. The microcircuit card according to claim 25, characterized in that the card body is produced in the form of an alternation of such layers.

* * * * *